US 9,751,254 B2

(12) United States Patent
Barlow et al.

(10) Patent No.: US 9,751,254 B2
(45) Date of Patent: Sep. 5, 2017

(54) APPARATUS FOR TREATING SUBSTRATES (71) Applicants: Gary Barlow, Liverpool (GB);
Nicholas Copeland, Cheshire (GB)

(72) Inventors: Gary Barlow, Liverpool (GB);
Nicholas Copeland, Cheshire (GB)

(73) Assignee: BOBST MANCHESTER LTD (GB)

( * ) Notice: Subject to any disclaimer, the term of this patent is extended or adjusted under 35 U.S.C. 154(b) by 0 days.

(21) Appl. No.: 13/632,597

(22) Filed: Oct. 1, 2012

(65) Prior Publication Data
US 2013/0026036 A1 Jan. 31, 2013

Related U.S. Application Data (63) Continuation-in-part of application No. 12/576,318, filed on Oct. 9, 2009, now abandoned.

(30) Foreign Application Priority Data

Oct. 9, 2008 (EP) .................................. 08017713

(51) Int. Cl.
C23C 14/34 (2006.01)
B29C 59/14 (2006.01)
C23C 14/56 (2006.01)
H01J 37/32 (2006.01)
H01J 37/34 (2006.01)

(52) U.S. Cl.
CPC ............ *B29C 59/14* (2013.01); *C23C 14/564* (2013.01); *H01J 37/32009* (2013.01); *H01J 37/32541* (2013.01); *H01J 37/32568* (2013.01); *H01J 37/34* (2013.01)

(58) Field of Classification Search
CPC ... C23C 14/564; H01J 37/34; H01J 37/32541; H01J 37/32568; H01J 37/32009; B29C 59/14
USPC ............ 204/298.21, 298.22, 298.25, 298.26; 118/719
See application file for complete search history.

(56) References Cited

U.S. PATENT DOCUMENTS

| 4,010,291 | A | * | 3/1977 | Katsube et al. .............. 427/109 |
| 4,380,211 | A | * | 4/1983 | Shinohara ............. C23C 14/564 |
| | | | | 118/715 |
| 5,096,562 | A | | 3/1992 | Boozenny et al. ...... 204/298.22 |
| 5,158,660 | A | | 10/1992 | Devigne et al. ......... 204/298.21 |
| 5,178,743 | A | * | 1/1993 | Kumar ..................... 204/298.21 |
| 5,462,602 | A | * | 10/1995 | Misiano ............... C23C 14/562 |
| | | | | 118/718 |
| 5,464,518 | A | | 11/1995 | Sleck et al. ............. 204/192.12 |

(Continued)

FOREIGN PATENT DOCUMENTS

WO WO2009/022184 * 2/2009

*Primary Examiner* — Rodney McDonald
(74) *Attorney, Agent, or Firm* — Ostrolenk Faber LLP (57) ABSTRACT Apparatus for coating a substrate with a material in a chamber subject, during use, to substantial evacuation, which includes a coating station within the chamber for coating a substrate by sputtering and/or by evaporation; at least one treating station disposed in serial with the coating station and equipped with a plasma treater incorporating a plasma generator in sufficient proximity to the substrate to treat the substrate; a magnetic device for generating a magnetic field; at least one cylindrical electrode surrounding the magnetic device, the plasma treater incorporates a device for rotating the electrode about its longitudinal axis.

28 Claims, 5 Drawing Sheets (56) References Cited

U.S. PATENT DOCUMENTS

| | | | |
|---|---|---|---|
| 5,489,369 A * | 2/1996 | Bjornard et al. | 204/298.25 |
| 5,704,980 A * | 1/1998 | Misiano | C23C 14/0042 |
| | | | 118/708 |
| 5,968,328 A * | 10/1999 | Teschner et al. | 204/298.25 |
| 2008/0248215 A1* | 10/2008 | Sauer et al. | 427/534 |
| 2008/0264785 A1* | 10/2008 | De Bosscher et al. | 204/298.15 |

* cited by examiner

APPARATUS FOR TREATING SUBSTRATES

CROSS REFERENCE TO RELATED APPLICATION

The present application is a continuation in part of U.S. patent application Ser. No. 12/576,318, filed Oct. 9, 2009, which claims priority of European Application No. 08017713.2, filed Oct. 9, 2008, the contents of which are incorporated in full herein by reference.

TECHNICAL FIELD

The invention relates to a) an apparatus for coating a substrate with a material in a chamber subject, during use, to substantial evacuation; b) a plasma treater; and c) a method of treating a substrate in a process of coating by sputtering and/or evaporation in a chamber subject to substantial evacuation during use.

BACKGROUND ART

The closest prior art is the Applicant's own plasma treater which is used to prepare the surface of a substrate before submission to the coating process, and this treater is also called plasma pre-treater. This prior art plasma treater incorporates two cylindrical electrodes surrounding a magnetic means. The cylindrical electrodes are fixed relative to their casing. The known pre-treater generates a plasma cloud using a magnetic array, a reactive gas, an inert gas and a medium frequency alternating current (AC) power applied to an electrode.

By arranging that the substrate passes in close proximity to the electrode, plasma interacts with the surface of the substrate by removing moisture and other contaminants. It also acts to increase the number of nucleation sites through the introduction of polar groups, resulting in an improvement of the coating process with homogeneous surface morphology and less defects.

There is a further known plasma treater which is used to prepare the surface of a substrate for the process following the coating process, and this treater is also called plasma post-treater. A post treatment allows, for example, unwanted particles to be removed from the coated substrate by the method of sputtering.

Unfortunately, the treater of the prior art has a number of drawbacks. It requires regular maintenance after a period of process due to the electrode tube being "dirtied" by the plasma deposits. These deposits can cause arcing which can result in the closing down of the power supply units which incorporate means for detecting this condition.

This maintenance requires the electrode tubes to be cleaned in order to remove the deposits. The preferred method of removal is a manual method using various abrasive materials.

One of the problems which the inventive concept addresses is how to avoid or at least minimise these frequent and labour intensive maintenance cycles.

SUMMARY OF THE INVENTION

In a first broad independent aspect, the invention provides an apparatus comprising a coating station for coating a substrate by sputtering and/or by evaporation; and a treating station located upstream from said coating station equipped with a plasma pre-treater incorporating apparatus for generating plasma in sufficient proximity to said substrate to treat said substrate; magnetic means for generating a magnetic field; and at least one cylindrical electrode surrounding said magnetic means; wherein said plasma pre-treater incorporates apparatus for rotating said electrode about its longitudinal axis.

This configuration is particularly advantageous because it allows the pre-treatment to occur with the benefits of removing moisture and other contaminants which may be present on a substrate as the particles are removed by the method of sputtering. It avoids or at least minimises potential down times due to arcing and associated short circuits. It also increases the number of nucleation sites which will result in an improvement in the subsequent coating process. The coating is therefore homogeneous and with fewer defects than would otherwise be the case without such a pre-treatment.

In a second broad independent aspect, the invention provides an apparatus comprising a coating station for coating a substrate by sputtering and/or by evaporation; and a treating station located downstream from said coating station equipped with a plasma post-treater incorporating apparatus for generating plasma in sufficient proximity to said substrate to treat said substrate; magnetic apparatus for generating a magnetic field; and at least one cylindrical electrode surrounding said magnetic apparatus; characterised in that said plasma post-treater incorporates apparatus for rotating said electrode about its longitudinal axis.

This configuration is particularly advantageous because it allows unwanted particles to be removed by the method of sputtering. It reduces the likelihood or entirely avoids any down time for specific cleaning and other maintenance actions associated with the treater. It also allows the coated surface to be prepared in an improved manner for the next process.

In a subsidiary aspect, the apparatus comprises both a plasma pre-treater and a plasma post-treater which incorporate apparatus for rotating respective electrodes about their respective longitudinal axes. An overall beneficial effect arises by this combination by further improving the quality of coated substrate, reducing the likelihood of down time and improving the quality/throughput ratio.

In a further subsidiary aspect, said plasma pre-treater is segregated from said sputtering and/or said evaporation station; whereby a first pressure level is present in the vicinity of said pre-treater while a second pressure level is present in the vicinity of said sputtering and/or said evaporation station; and the first pressure level being greater than the second pressure level. This configuration allows the pre-treatment and the coating process to occur in separate environments for an overall beneficial effect as discussed above.

In a further subsidiary aspect, said plasma post-treater is segregated from said sputtering and/or said evaporation station; whereby a first pressure level is present in the vicinity of said post-treater while a second pressure level is present in the vicinity of said sputtering and/or said evaporation station; and the first pressure level being greater than the second pressure level. This configuration further improves the specific qualities of the individual operations while combining for improvements of quality of product and process.

In a further subsidiary aspect, said pre-treater incorporates two electrodes and apparatus for simultaneously rotating said electrodes. This configuration is particularly advantageous because it minimises the number of components required while achieving advantageous control of the pre-treatment process.

In a further subsidiary aspect, said post-treater incorporates two electrodes and apparatus for simultaneously rotating said electrodes. Similarly when compared to the pre-treater, such a configuration further improves the overall quality of the produced substrate and the process while minimising the number of components required to achieve the improved effects.

In a further subsidiary aspect, said apparatus further comprises a connector for connecting to a power source, brushes for transmitting power to said electrode during the rotation of said electrodes and a box sealing said brushes in an environment with a greater pressure than the evacuated chamber where said treater is located. This configuration allows the connection to be optimised while minimising and/or almost entirely avoiding undue wear of the brushes.

In a third broad independent aspect, the invention provides a plasma treater comprising apparatus for generating plasma in sufficient proximity to a substrate in order to treat said substrate; magnetic apparatus for generating a magnetic field only in a front side of said treater where in use said substrate passes; at least one cylindrical electrode surrounding said magnetic apparatus; and a body covering a rear side of said electrode; wherein said electrode is rotatable about its longitudinal axis and said treater further incorporates apparatus for rotating said electrode about its longitudinal axis.

This plasma treater is particularly advantageous because it avoids a prior art requirement of manual cleaning. It also allows unwarranted deposits on the electrode surface to be removed by the method of sputtering. It also allows the quality improvements of known pre-treatments to be achieved.

In a further subsidiary aspect, said plasma treater comprises a connector for connection to a power source, brushes for transmitting power to said electrode during the rotation of said electrode and a box sealing said brushes in an environment, when said treater is in use, with a greater pressure than the evacuated chamber where said treater is located in use. This configuration is particularly advantageous to minimise any undue wear and tear of the power connection to the electrode.

In a further subsidiary aspect, said treater incorporates two electrodes and apparatus for simultaneously rotating said electrodes. This configuration is particularly advantageous because it minimises the number of components required while achieving a particularly regular and efficient pre-treatment process.

In a further subsidiary aspect, said two electrodes are configured to rotate in opposite directions. This configuration is also particularly advantageous because it minimises the number of components required while producing a particularly compact overall configuration which may for example lend itself advantageously to retrofitting to an existing apparatus where the available space for retrofitting is minimal.

In a further subsidiary aspect, said body incorporates channels for circulation of cooling liquid.

In a further subsidiary aspect, said electrode incorporates channels for circulation of cooling liquid. These configurations are particularly advantageous because they allow the plasma affected areas to be cooled while allowing the treater to be relatively compact.

In a fourth broad independent aspect, the invention provides a method of treating a substrate in a process of coating by sputtering and/or evaporation in a chamber subject to substantial evacuation during use, comprising the steps of:

placing, in a station located upstream from a coating station, a plasma pre-treater incorporating magnetic apparatus for generating a magnetic field; and at least one cylindrical electrode surrounding said magnetic apparatus;

generating plasma; and submitting said substrate to be coated to said generated plasma in the vicinity of said plasma pre-treater;

wherein said method further comprises the step of rotating said electrode about its longitudinal axis as the substrate is displaced past the treater.

In a fifth broad independent aspect, the invention provides a method of treating a substrate in a process of coating by sputtering and/or evaporation in a chamber subject to substantial evacuation during use, comprising the steps of:

placing, in a station located downstream from a coating station, a plasma post-treater incorporating magnetic apparatus for generating a magnetic field; and at least one cylindrical electrode surrounding said magnetic apparatus;

generating plasma; and submitting said coated substrate to plasma in the vicinity of said plasma post-treater;

characterised in that said method further comprises the step of rotating said electrode about its longitudinal axis as the substrate is displaced past the treater.

In a further subsidiary aspect, the method comprises the steps of submitting said substrate to both a pre-treater and a post-treater.

In a further subsidiary aspect, the invention provides a method further comprising the steps of segregating said pre-treater from said sputtering and/or said evaporation station; and applying a first pressure in the vicinity of said pre-treater while applying a second pressure in the vicinity of said sputtering and/or said evaporation station; the first pressure level being greater than the second pressure level.

In a further subsidiary aspect, the invention provides a method further comprising the steps of segregating said post-treater from said sputtering and/or said evaporation station; and applying a first pressure in the vicinity of said post-treater while a second pressure level is present in the vicinity of said sputtering and/or evaporation station; wherein the first pressure level is greater than the second pressure level.

In a further broad independent aspect, the invention provides a plasma treater substantially as described and/or illustrated in any appropriate combination of the accompanying text and/or figures.

BEST MODE FOR CARRYING OUT THE INVENTION

Figure 1:
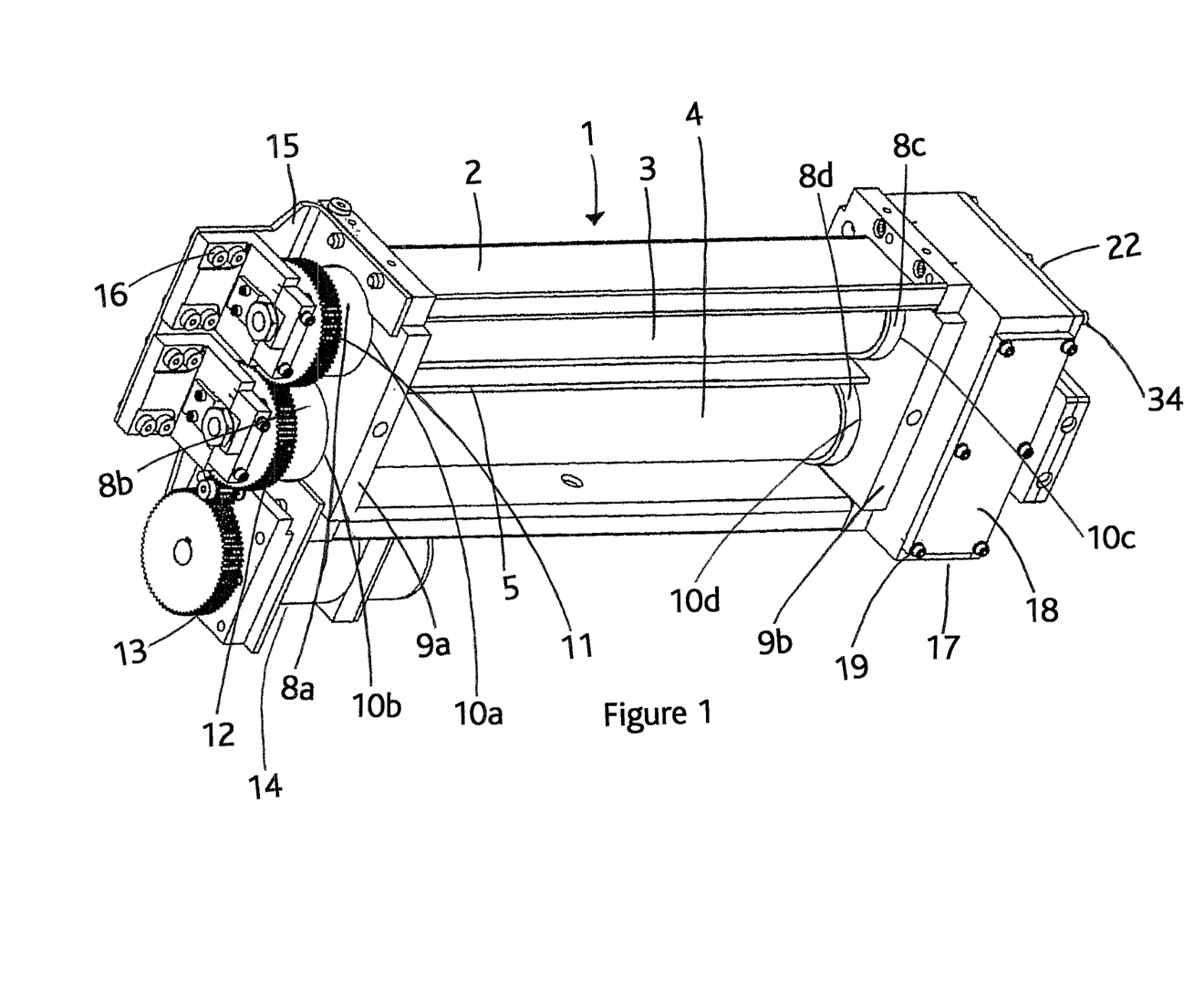
FIG. 1 shows a perspective view of a plasma treater according to the invention.
Figure 4:
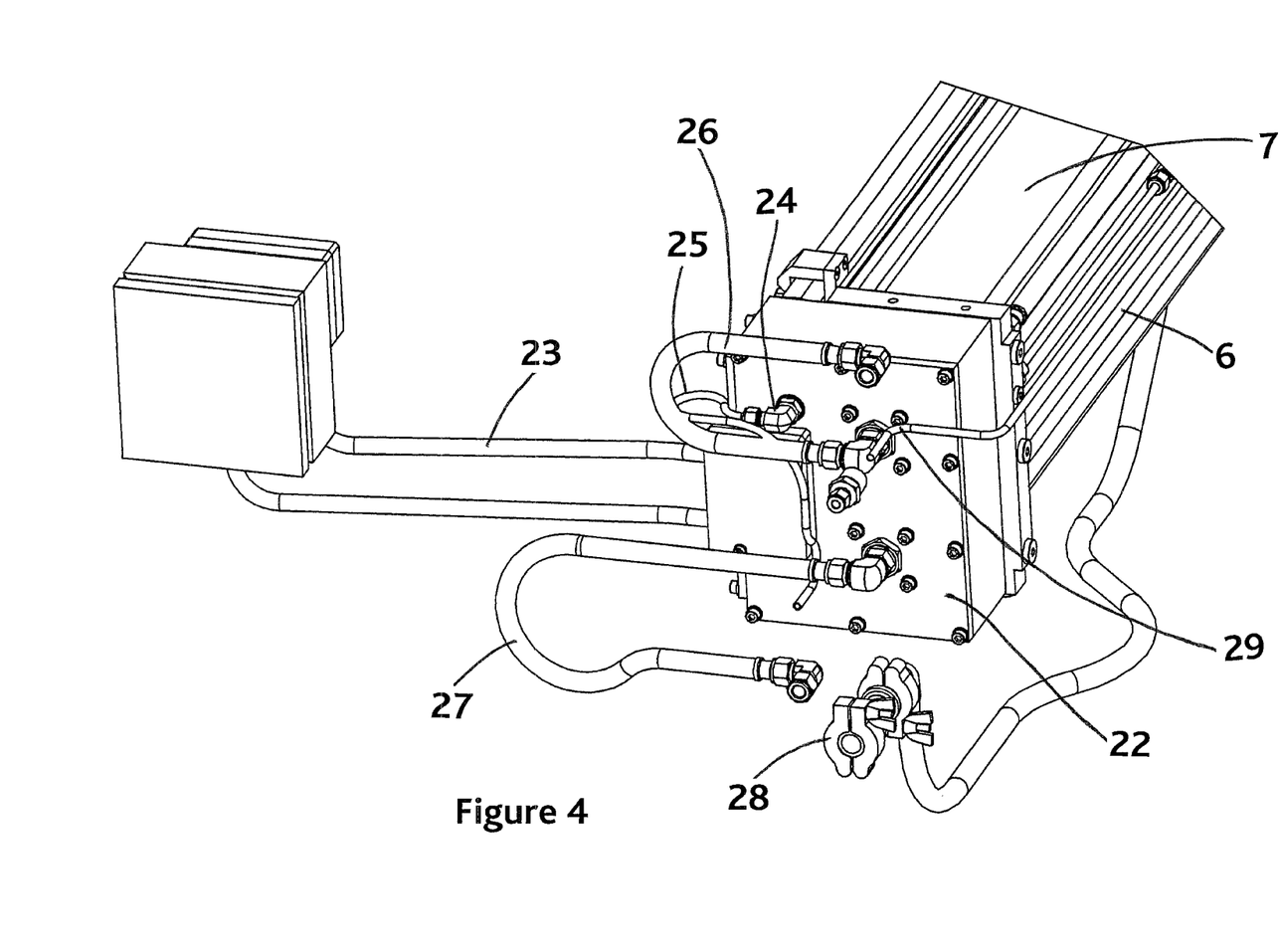
FIG. 4 shows a perspective view of the atmospheric box of the treater and of an arrangement of services associated with the treater.

FIG. 1 shows a treater generally referenced 1. The treater 1 incorporates an aluminium extrusion body 2 with an internal W-shaped in cross-section configuration in order to accommodate cylindrical electrodes 3 and 4 in respective cavities. Body 2 incorporates a number of cooling channels for a suitable cooling fluid to pass, such as water, in order to keep the plasma affected areas cooled. A web 5 splits the body into the two electrode receiving cavities. As can be seen in FIG. 4, the rear portion 6 and the upper portion 7 of the body are substantially flat. Seals 8a, 8b, 8c and 8d are provided at either end of the electrode. These seals may take the form of a ceramic shield. The respective seals are supported in respective blocks 9a and 9b incorporating mating cylindrical bearing surfaces 10a, 10b, 10c and 10d.

Each electrode is connected and rotatable with a gear such as gear 11 and gear 12. Gears 11 and 12 incorporate a plurality of teeth which are suitable for being meshed with the teeth of a neighbouring gear; whereby when gear 12 is rotated in a direction, gear 11 is rotated in a counter direction. As an alternative embodiment, gears 11 and 12 may be disconnected from one another and rotated in the same direction. A driving gear 13 is located in communication with gear 12. Gear 13 is driven by a motor and/or gear box assembly 14.

Race tracks 32 and 33 (partially shown in FIG. 3) are provided where the effective plasma treatment occurs as the substrate is displaced in front of the treater.

Figure 5:
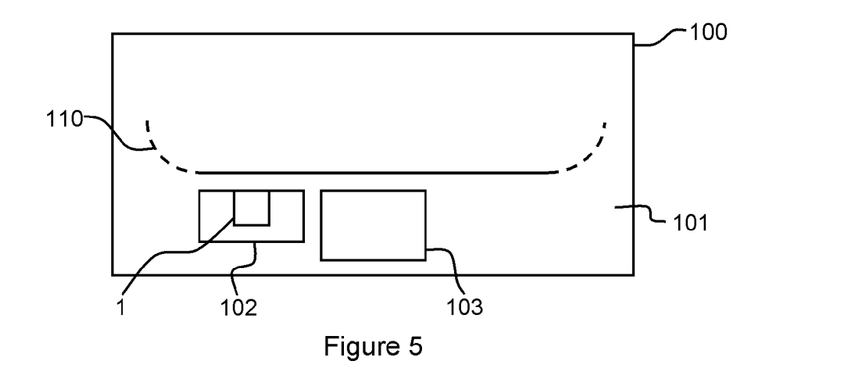
FIG. 5 shows a synoptic view of an apparatus for coating a substrate with a material in a chamber according to a first embodiment.
Figure 6:
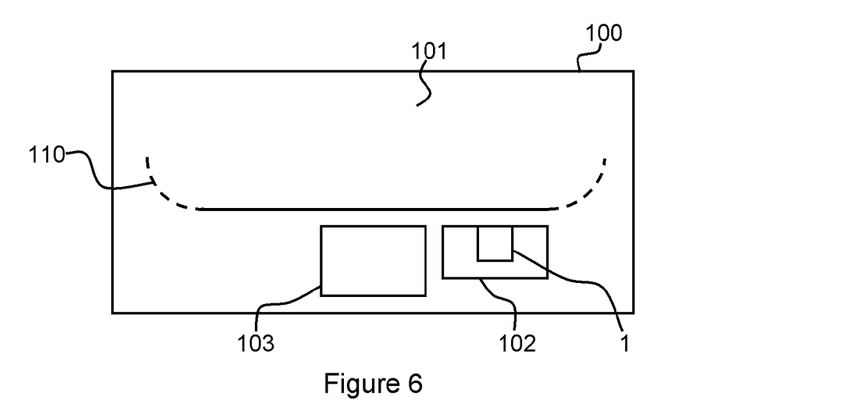
FIG. 6 shows a synoptic view of an apparatus for coating a substrate with a material in a chamber according to a second embodiment.
Figure 7:
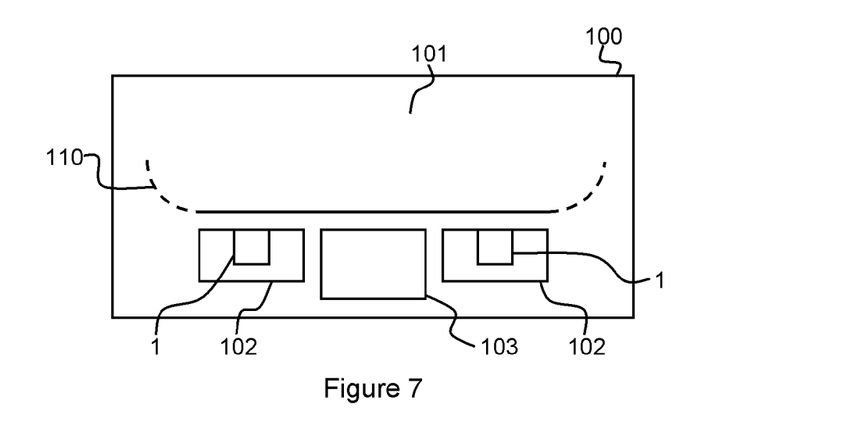
FIG. 7 shows a synoptic view of an apparatus for coating a substrate with a material in a chamber according to a third embodiment.

A unitary support plate 15 is envisaged with a number of fastening means such as fastening means 16 in order to allow the treater 1 to be secured to an appropriate support surface in, for example, an apparatus 100 for coating a substrate 110 with a material in a chamber 101 subject, during use, to substantial evacuation, also called evacuation chamber or vacuum chamber 101 (referring to FIGS. 5 to 7). Further attachment means are envisaged at the opposite end of the treater 1 to secure the treater 1 at both its extremities if necessary. The unitary plate 15 is L-shaped in cross-section and provides a number of cut-outs to accommodate the various rotatable seals.

Figure 2:
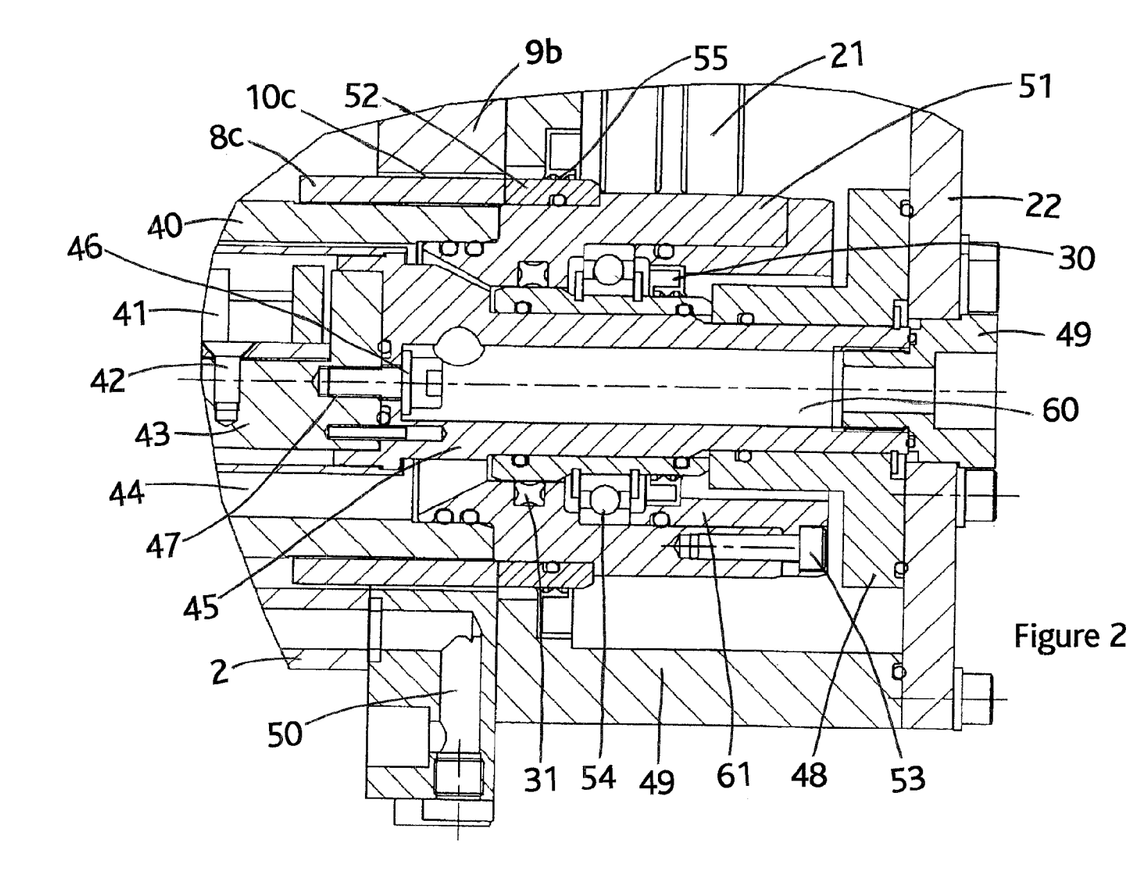
FIG. 2 shows a cross-sectional view of a seal and bearing arrangement for an extremity of an electrode.
Figure 3:
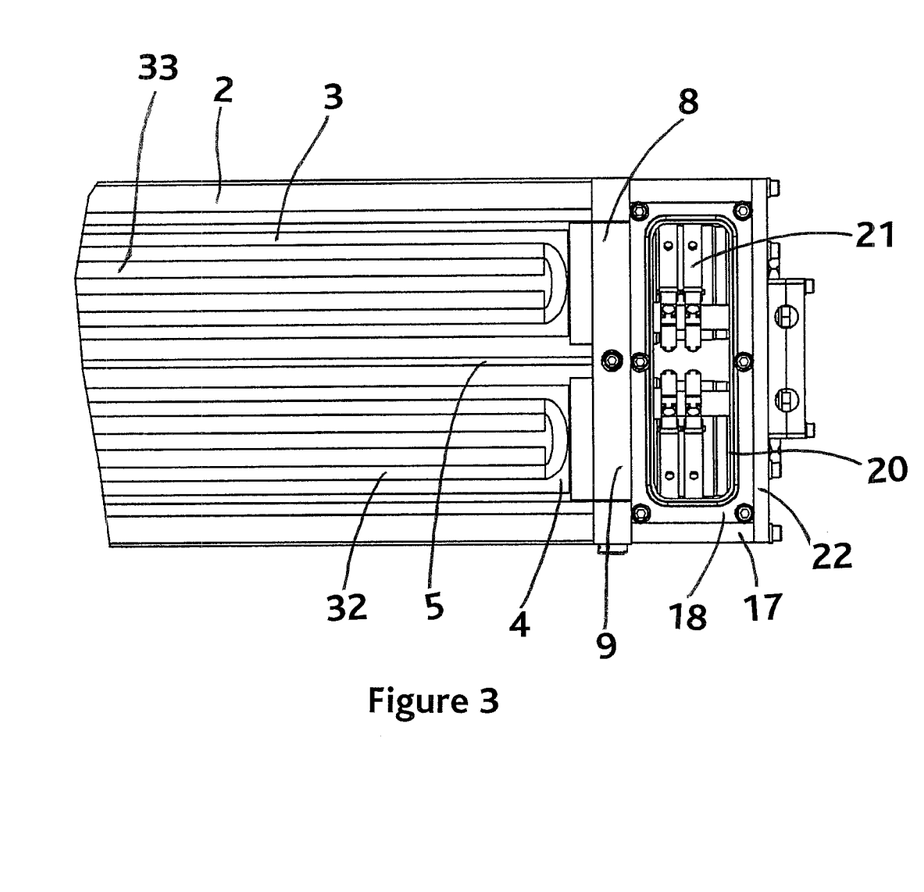
FIG. 3 shows a top view of the atmospheric box end of the treater.

An atmospheric box 17 is provided at the opposite extremity to the driving arrangement which has just been described. The atmospheric box 17 provides within it an environment with a greater pressure than the evacuation chamber which keeps brushes 21 which it encloses out of the vacuum environment in order to reduce the likelihood of arcing between the brushes and the electrodes. The atmospheric box incorporates an access window 18 with sealing means located between the window and the box 17. A number of fastening elements such as fastener 19 are located through apertures provided at regular intervals along the periphery of the window in order to accommodate corresponding fasteners. The access window is of greater dimensions than the actual aperture 20 (as shown in FIG. 3) provided by the box. Appropriate connectors for a connection to a power source are envisaged which would lead to the brushes 21 (as shown in FIG. 2 and FIG. 3). In a preferred embodiment, the brushes are made of carbon or other similar material facilitating the conduction of electricity from the power source to the electrode while the electrode is being rotated. A lateral panel 22 is provided with a number of regularly spaced fastening elements such as screw 34. The lateral panel incorporates a number of cut-outs corresponding to individual services as shown in further detail in FIG. 4.

FIG. 4 shows the power feed 23 establishing the connection between a power supply and the treater. A breather 24 is provided as a connector between the atmospheric box and a nylon flexible tube 25 for connection to a location outside of the vacuum chamber in which a treater is located in use. A cooling water feed 26 is provided to feed cooling fluid to the body 7 and/or electrodes 3 and 4. Once the cooling fluid has circulated through the appropriate parts of the treater, it is then returned through return line 27. A vacuum gauge test point is also envisaged. Furthermore, a gas feed 29 is provided. The gas mixtures or gases are preferably selected from the following group: 80% Ar/20% $O_2$, 80% $N_2$/20% $O_2$, 80% He/20% $O_2$, and 100% $O_2$. The gas distribution is carried out by means of channels in the aluminium extrusion of the body. In the case of gas mixtures, the gases have been previously mixed and fed into either end of the extrusion to ensure uniformity of distribution.

Inside the electrodes, there is provided magnetic means for applying a field to the area immediately in front of the treater where the substrate is passed during the process.

The velocity of the rotation of the electrodes may be kept between 0 and 1000 rpm (revolutions per minute). The velocity of the rotation of the electrodes is preferably advantageously kept between 0 and 6 rpm (revolutions per minute) and the preferred working temperature is approximately 50° Celsius with a cooling water rate of 8 liters per minute. The electrodes are preferably selected from the following group: aluminium, stainless steel, non-ferrous metals, ceramic, titanium, and appropriate polymers.

As can be seen in FIG. 2, a variety of seals are employed such as a ceramic seal 8, a grease seal 30 and a rotating seal 31.

FIG. 2 shows a cross-section at the extremity of electrode 3. Rotatable electrode shield 40 houses magnetic apparatus 41. The electrode shield 40 is dynamic while the magnetic apparatus is stationary. A screw 42 is provided to secure the magnetic apparatus 41 to a shaft 43. As can be seen in the figure, the magnetic apparatus are provided on only one side of shaft 43 which is the front side of the treater in order to act on the passing substrate. A water channel 44 is provided between electrode shield 40 and shaft 43. Shaft 43 is secured to a bush 45 by an appropriate fastening element such as screw 46 which engages a corresponding threaded recess 47. Along the central axis of bush 45, there is also provided a channel 60 through which water or any other suitable cooling liquid enters the electrode. Bush 45 is also static while being secured to plate 22 via a further bush 48 and a screw threaded connector 49. Both plate 22 and box wall 49 are static. Block 9b is also static and presents a cylindrical bearing surface 10c. In block 9b, there is also provided a further water or fluid channel 50 for communicating cooling fluid to and/or from body 2 of the treater.

The following dynamic components are also present: the rotatable electrode shield 40, its supporting bush 51 which is in communication with brushes such as brush 21, seal 8c, hard seal runner 52, end portion 61 and its corresponding fastening element 53.

A ball bearing 54 is provided between the static portions and the dynamic portions. A further dynamic seal 55 is provided between the rotatable portions and the box wall 49. A further dynamic seal 31 is provided between the dynamic and static portions.

The treater 1 may be placed in a treating station 102 located upstream from a coating station 103 of a vacuum coater 100 in order to perform a pre-treatment (referring to FIGS. 5 and 7). Preferably, it is located in a part of the vacuum coater 100 where a relatively high pressure is present when compared to the pressure in a separate station of the vacuum coater 100 where the actual process of sputtering and/or evaporating a material such as aluminium takes place.

Advantageously, the vacuum coater 100 incorporates a further segregated treating station 102 located downstream from the coating station 103 in order to perform a post-treatment (referring to FIGS. 6 and 7). Preferably, the pressure in the treating station 102 is relatively high compared to the pressure in the coating station 103 in order to facilitate post-treatment.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

The invention claimed is:

1. An apparatus for coating a substrate with a material in a chamber subject, during use, to substantial evacuation, the apparatus comprising:
   a coating station within said chamber configured and operable for coating a substrate by evaporation at a first pressure;
   at least one treating station disposed in series with and segregated from the coating station and equipped with a plasma treater, the treater incorporating a device configured and operable for generating plasma in sufficient proximity to the substrate and to treat the substrate with the plasma at a second pressure, the second pressure being greater than the first pressure, the at least one treating station comprising;
   a magnetic device configured and operable for generating a magnetic field;
   at least one cylindrical electrode surrounding the magnetic device;
   a rotation device operable for rotating the electrode about a longitudinal axis of said electrode thereby in operation causing deposits on the electrode surface to be removed,
   wherein the plasma treater receives a gas that includes at least oxygen.

2. The apparatus according to claim 1, wherein treating station is located upstream of the coating station and is configured and operable to perform a pre-treatment on the substrate.

3. The apparatus according to claim 2, further comprising a second treating station located downstream of the coating station, the second treating station configured and operable to perform a post-treatment on the substrate.

4. The apparatus according to claim 2, wherein the plasma treater further incorporates a second electrode, the second electrode being arranged to rotate about its longitudinal axis, the two electrodes arranged to simultaneously rotate.

5. The apparatus according to claim 4, wherein the two electrodes are configured to rotate in opposite directions.

6. The apparatus according to claim 1, further comprising a connector for connection to a power source, brushes for transmitting power from the power source to at least one electrode during the rotation of said electrode; and a box configured and operable for sealing the brushes in an environment with a third pressure, the third pressure being greater than the second.

7. The apparatus of claim 4, further comprising a body having a web that defines two cavities, wherein each electrode is disposed in a respective cavity.

8. The apparatus according to claim 1, wherein treating station is located downstream of said coating station and configured and operable to perform a post-treatment on said substrate.

9. The apparatus according to claim 6, wherein the two electrodes are configured to rotate in opposite directions.

10. The apparatus according to claim 1, wherein the plasma treater further incorporates a second electrode, the second electrode being arranged to rotate about its longitudinal axis, the two electrodes arranged to simultaneously rotate.

11. The apparatus according to claim 2, wherein the treating station is configured to remove moisture or other contaminants from the substrate.

12. The apparatus according to claim 8, wherein the treating station is configured to remove contaminant particles from the substrate.

13. The apparatus according to claim 1, wherein the coating station is configured and operable to coat a substrate with aluminium.

14. The apparatus according to claim 1, wherein the at least one cylindrical electrodes comprise aluminium, stainless steel, non-ferrous metals, ceramic, titanium, or polymer.

15. The apparatus according to claim 1, wherein the coating station is configured and operable to coat a substrate with aluminium and the at least one cylindrical electrode of the treater is made from aluminium.

16. The apparatus according to claim 1, wherein the coating station is configured and operable to coat a substrate by evaporation.

17. The apparatus according to claim 1, wherein the treating station comprises a body arranged to accommodate two cylindrical electrodes each in a respective cavity, the body further being arranged to receive a web or substrate such that in use the substrate web splits the body into the two electrode receiving cavities.

18. The apparatus according to claim 1, wherein the magnetic device is arranged to generate a magnetic field in a front side of the treating station through which in use the substrate web passes but not a rear side, the apparatus further comprising a body covering the rear side of the cylindrical electrode.

19. A plasma treater adapted to plasma treat a substrate, the treater comprising a device configured and operable for generating plasma in sufficient proximity to the substrate for treating the substrate with the plasma,
   a magnetic device configured and operable for generating a magnetic field,
   at least one cylindrical electrode surrounding the magnetic device,
   a rotation device operable for rotating the electrode about a longitudinal axis of said electrode thereby in operation causing deposits on the electrode surface to be removed,
   the treater being arranged to be disposed in serial with a coating station adapted to coat the substrate at a coating pressure by evaporation,
   the treater being further arranged to be segregated from and have a separate pressure environment from the coating station such that in operation the treater is arranged to operate at a treating pressure, the treating pressure being higher than the coating pressure, and the treater receives a gas that includes at least oxygen.

20. The plasma treater according to claim 19, wherein the treater further incorporates a second electrode, the second electrode being arranged to rotate about its longitudinal axis, the two electrodes arranged to simultaneously rotate.

21. The plasma treater according to claim 20, wherein the two electrodes are configured to rotate in opposite directions.

22. The plasma treater according to claim 19, wherein the at least one cylindrical electrode comprises aluminium, stainless steel, non-ferrous metals, ceramic, titanium, or polymer.

23. The plasma treater according to claim 20, further comprising a body arranged to accommodate two cylindrical electrodes each in a respective cavity, the body further being arranged to receive a web or substrate such that in use the substrate web splits the body into the two electrode receiving cavities.

24. The plasma treater according to claim 19, wherein the magnetic device is arranged to generate a magnetic field in a front side of the treater through which in use a substrate web passes but not a rear side, the treater further comprising a body covering the rear side of the cylindrical electrode.

25. The plasma treater according to claim 19, further comprising a connector for connection to a power source, brushes for transmitting power from the power source to at least one electrode during the rotation of said electrode; and
   a box configured and operable for sealing the brushes in an environment with a third pressure, the third pressure being greater than the second pressure.

26. The apparatus according to claim 1, further comprising a second treating station that includes only one post-treater located downstream of the coating station, the second coating station being configured and operable to perform a post-treatment on the substrate.

27. An apparatus for coating a substrate with a material in a chamber subject, during use, to substantial evacuation, the apparatus comprising:
   a coating station within said chamber configured and operable for coating a substrate by evaporation at a first pressure;
   at least one treating station disposed in series with and segregated from the coating station and equipped with a plasma treater, the treater incorporating a device configured and operable for generating plasma in sufficient proximity to the substrate and to treat the substrate with the plasma at a second pressure, the second pressure being greater than the first pressure, the at least one treating station comprising;
   a magnetic device configured and operable for generating a magnetic field;
   at least one cylindrical electrode surrounding the magnetic device;
   a rotation device operable for rotating the electrode about a longitudinal axis of said electrode thereby in operation causing deposits on the electrode surface to be removed,
   wherein the treating station includes only one pre-treater located upstream of the coating station and is configured and operable to perform a pre-treatment on the substrate.

28. The apparatus according to claim 27, further comprising a second treating station that includes only one post-treater located downstream of the coating station, the second coating station being configured and operable to perform a post-treatment on the substrate.

* * * * *